(12) United States Patent
Lee

(10) Patent No.: US 7,598,836 B2
(45) Date of Patent: Oct. 6, 2009

(54) MULTILAYER WINDING INDUCTOR

(75) Inventor: Sheng-Yuan Lee, Taipei (TW)

(73) Assignee: Via Technologies, Inc., Taipei (TW)

( * ) Notice: Subject to any disclaimer, the term of this patent is extended or adjusted under 35 U.S.C. 154(b) by 159 days.

(21) Appl. No.: 11/558,944

(22) Filed: Nov. 13, 2006

(65) Prior Publication Data
US 2007/0267718 A1 Nov. 22, 2007

(30) Foreign Application Priority Data
May 17, 2006 (TW) .............................. 95117418 A

(51) Int. Cl.
*H01F 21/02* (2006.01)
(52) U.S. Cl. ................. 336/147; 336/225; 336/180; 336/186; 336/232; 336/223; 257/531; 257/277; 257/E21.022
(58) Field of Classification Search ........................ None
See application file for complete search history.

(56) References Cited

U.S. PATENT DOCUMENTS 6,714,113 B1 * 3/2004 Abadeer et al. ............. 336/223

2002/0050626 A1 * 5/2002 Onuma et al. ............... 257/531
2006/0249810 A1 * 11/2006 Lee et al. .................... 257/531

* cited by examiner

*Primary Examiner*—Minh-Loan T Tran
*Assistant Examiner*—Fei Fei Yeung Lopez
(74) *Attorney, Agent, or Firm*—Thomas, Kayden, Horstemeyer & Risley

(57) ABSTRACT

A multilayer winding inductor. The inductor at least includes multi-level interconnect and single-level interconnect structures. The multi-level interconnect structure includes a plurality of conductive plugs and a plurality of looped conductive traces overlapping and separated from each other. Each looped conductive trace has a gap to define first and second ends and at least two conductive plugs disposed between the neighboring looped conductive traces. The single-level interconnect structure is located over the multi-level interconnect structure, comprising an uppermost looped conductive trace and a second conductive plug. The uppermost looped conductive trace has a gap to define first and second ends, and the second conductive plug is disposed between the second end of the uppermost looped conductive trace and the first end of the looped conductive trace adjacent thereto, thereby electrically connecting the multi-level and single-level interconnect structures.

20 Claims, 8 Drawing Sheets

MULTILAYER WINDING INDUCTOR

BACKGROUND OF THE INVENTION

1. Field of the Invention

The invention relates to a semiconductor device, and in particular to an on-chip inductor with a multi-level interconnect structure.

2. Description of the Related Art

Many digital and analog elements and circuits have been successfully applied in semiconductor integrated circuits. Such elements may include passive components, such as resistors, capacitors, or inductors. Typically, a semiconductor integrated circuit is formed on a silicon substrate. One or more dielectric layers are disposed on the substrate and one or more conductive layers are disposed in the dielectric layers. Those conductive layers may be employed to form on-chip elements, such as on-chip inductors, by current semiconductor technologies.

Conventionally, the on-chip inductor is formed over a semiconductor substrate and employed in integrated circuits designed for radio frequency (RF) band. FIGS. 1A and 1B illustrate a plan view of a conventional on-chip inductor with a planar spiral configuration and a cross-section along 1B-1B' line shown in FIG. 1A, respectively. The on-chip inductor is formed in a dielectric layer 104 on a substrate 100, comprising a spiral conductive trace 103 and an interconnect structure. The interconnect structure includes conductive plugs 105 and 109 and a conductive trace 107 embedded in a dielectric layer 102 and a conductive trace 111 embedded in the dielectric layer 104. The conductive trace 107, the dielectric layer 102, conductive plugs 105 and 109, the conductive trace 103, and the dielectric layer 104 are sequentially formed on the substrate 100. An internal circuit of the chip or an external circuit may provides a current passing through the coil, which includes the conductive trace 103, the conductive plug 105, the conductive trace 107, the conductive plug 109, and the meal trace 111, and utilize the inductance induced by the coil.

A principle advantage of the planar spiral inductor is increased level of the integration for the circuit due to reduced circuit elements located off the chip along with attendant need for complex interconnections. Moreover, the planar spiral inductor can reduce parasitic effect induced by the bond pads or bond wires between on-chip and off-chip circuits. The planar spiral inductor, however, is limited by the space for configuration of the spiral conductive trace 103 and the interval S of the neighboring regions of the spiral conductive trace 103. Thus, it is difficult to decrease the size $d_1$ of the planar spiral inductor. That is, the planar spiral inductor occupies a larger area of the chip, making it difficult to increase the integration and reduce manufacturing cost.

To decrease the size of the on-chip inductor, it has been suggested to form the inductor with solenoid structure, as shown in FIGS. 2A and 2B, a plan view of a conventional on-chip inductor with a solenoid structure and a cross-section along 2B-2B' line shown in FIG. 2A, respectively. The solenoid inductor has an upper conductive trace 203 and an overlapping lower conductive trace 209. The lower conductive trace 209 is embedded in a dielectric layer 202 on a substrate 200. The upper conductive trace 203 is embedded in a dielectric layer 204 on the dielectric layer 202. The upper conductive trace 203 has a gap $g_1$ to define a first end 50 and a second end 52, electrically connecting to the lower conductive trace 209 by a conductive plug 205 embedded in the dielectric layer 202 and adjacent to the second end 52 of the upper conductive trace 203. An internal circuit of the chip or an external circuit may provides a current passing through the coil, which includes the conductive trace 203, the conductive plug 205, the conductive trace 209, the conductive plug 207, and the meal trace 211, and utilize the inductance induced by the coil.

The multilayer winding inductor has a solenoid structure, thus its size $d_2$ is relatively smaller than the planar spiral inductor mentioned and can occupy a smaller area of the chip. The lower conductive trace 209, however, has a thickness less than the upper conductive trace 203 formed by an uppermost conductive layer due to the restrictions of manufacturing process. Therefore, the series resistance of the overlap winding inductor is increased, resulting in reduction of the quality factor (Q value) and a lower Q value compared to the planar spiral inductor.

Since the integrated circuit device performance is based on the size and the Q value of the on-chip inductor, there is a need to develop an improved on-chip inductor with decreased size and retained Q value thereof.

BRIEF SUMMARY OF INVENTION

A detailed description is given in the following embodiments with reference to the accompanying drawings. A multilayer winding inductor formed in a semiconductor chip is provided. An embodiment of a multilayer winding inductor comprises an insulating layer, a multi-level interconnect structure and a single-level interconnect structure. The insulating layer is disposed on a substrate. The multi-level interconnect structure is embedded in the insulating layer, comprising a plurality of first conductive plugs and a plurality of looped conductive traces overlapping and separated from each other. Each looped conductive trace has a gap to define first and second ends. The first conductive plug is disposed between the looped conductive traces to electrically connect the looped conductive traces, in which at least two first conductive plugs are disposed between the neighboring looped conductive traces. The single-level interconnect structure is embedded in the insulating layer and located over the multi-level interconnect structure, comprising an uppermost looped conductive trace and a second conductive plug. The uppermost looped conductive trace has a gap to define first and second ends. The second conductive plug is disposed between the second end of the uppermost looped conductive trace and the first end of the looped conductive trace adjacent thereto, to electrically connect the multi-level and single-level interconnect structures.

According to another embodiment of the present invention, an inductor formed in a semiconductor chip is provided. The semiconductor chip has a plurality of dielectric layers stacked on a substrate. The inductor comprises a plurality of first looped conductive traces and at least a second looped conductive trace formed in the dielectric layers respectively. The first looped conductive traces are coupled in parallel through the conductive plugs. The second looped conductive trace is overlapped with the first looped conductive traces and is coupled to the first looped conductive trace in series to form a conductive path of the inductor.

BRIEF DESCRIPTION OF DRAWINGS

The invention can be more fully understood by reading the subsequent detailed description and examples with references made to the accompanying drawings, wherein.

DETAILED DESCRIPTION OF INVENTION

The following description is of the best-contemplated mode of carrying out the invention. This description is provided for the purpose of illustrating the general principles of the invention and should not be taken in a limiting sense. The scope of the invention is best determined by reference to the appended claims. The multilayer winding inductor of the invention will be described in the following with reference to the accompanying drawings.

Figure 1A:
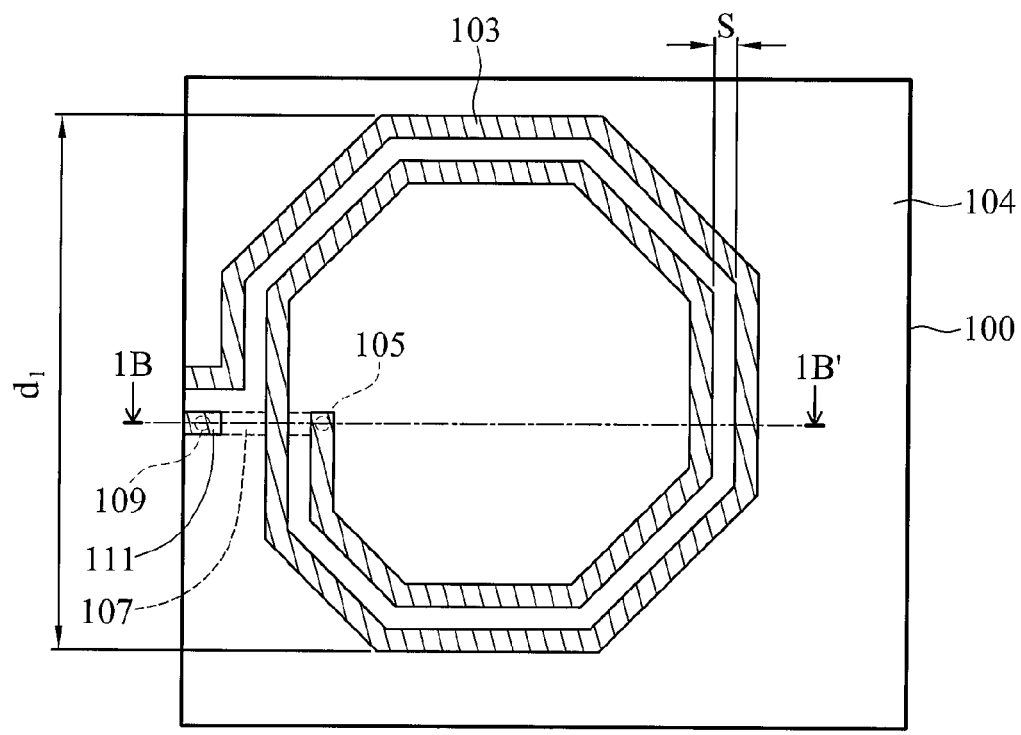
FIG. 1A is a plan view of a conventional on-chip inductor with a planar spiral configuration.
Figure 1B:
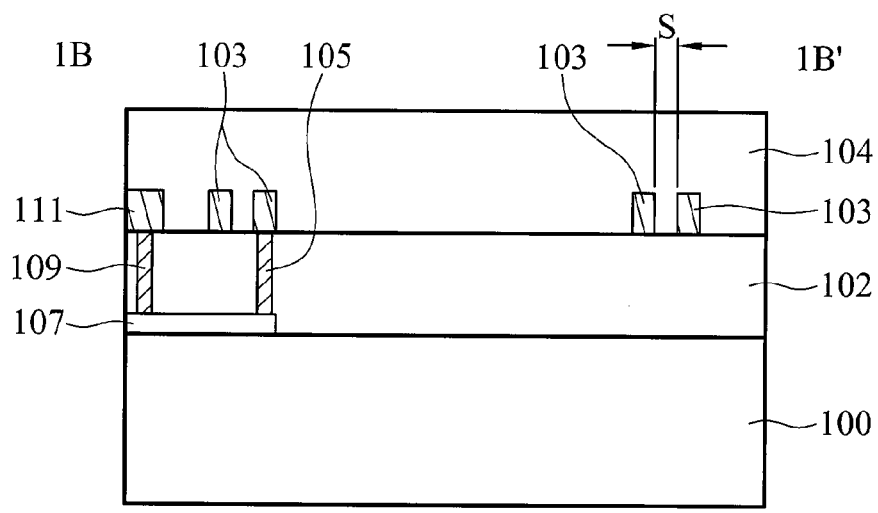
FIG. 1B is a cross-section along 1B-1B' line shown in FIG. 1A.
Figure 2A:
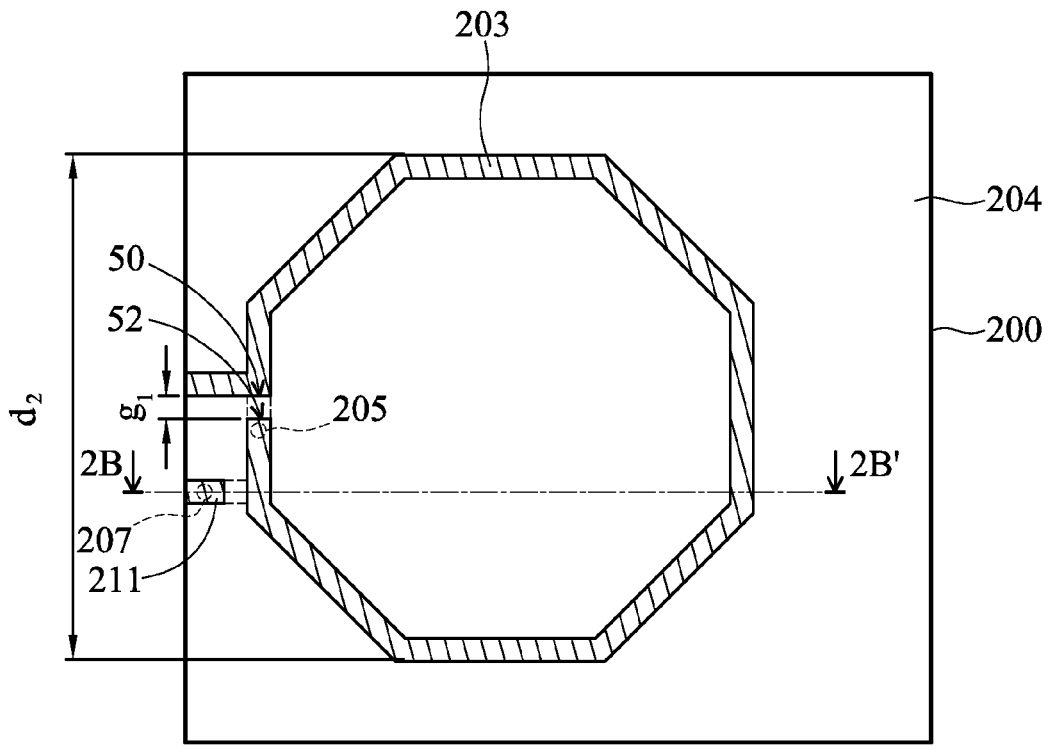
FIG. 2A is a plan view of a conventional multilayer winding inductor.
Figure 2B:
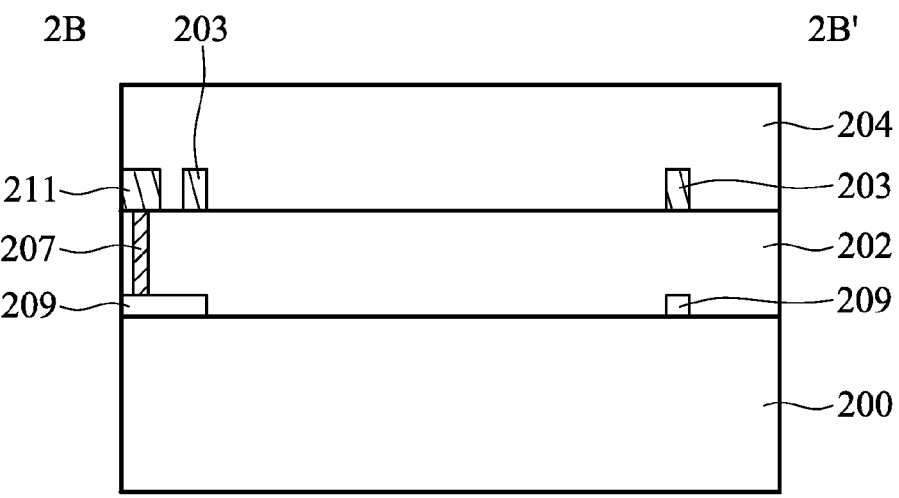
FIG. 2B is a cross-section along 2B-2B' line shown in FIG. 2A.
Figure 3A:
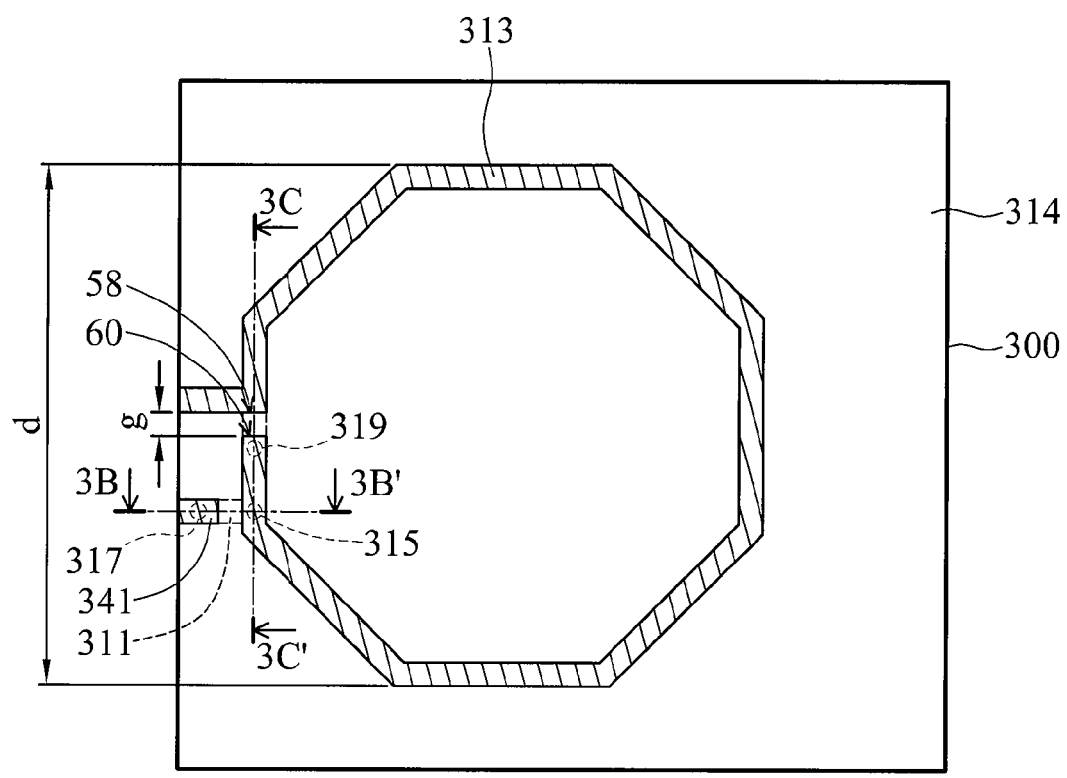
FIG. 3A is a plan view of an embodiment of a multilayer winding inductor.
Figure 3B:
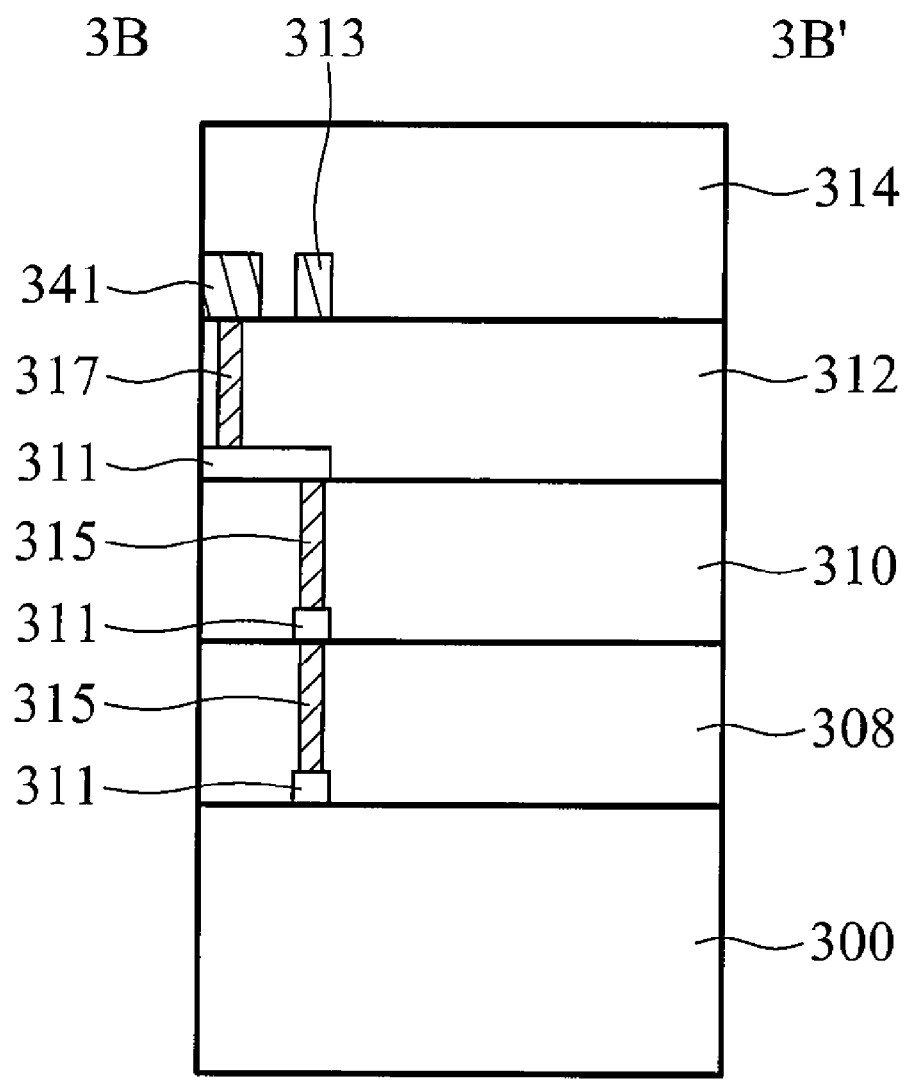
FIG. 3B is a cross-section along 3B-3B' line shown in FIG. 3A.
Figure 3C:
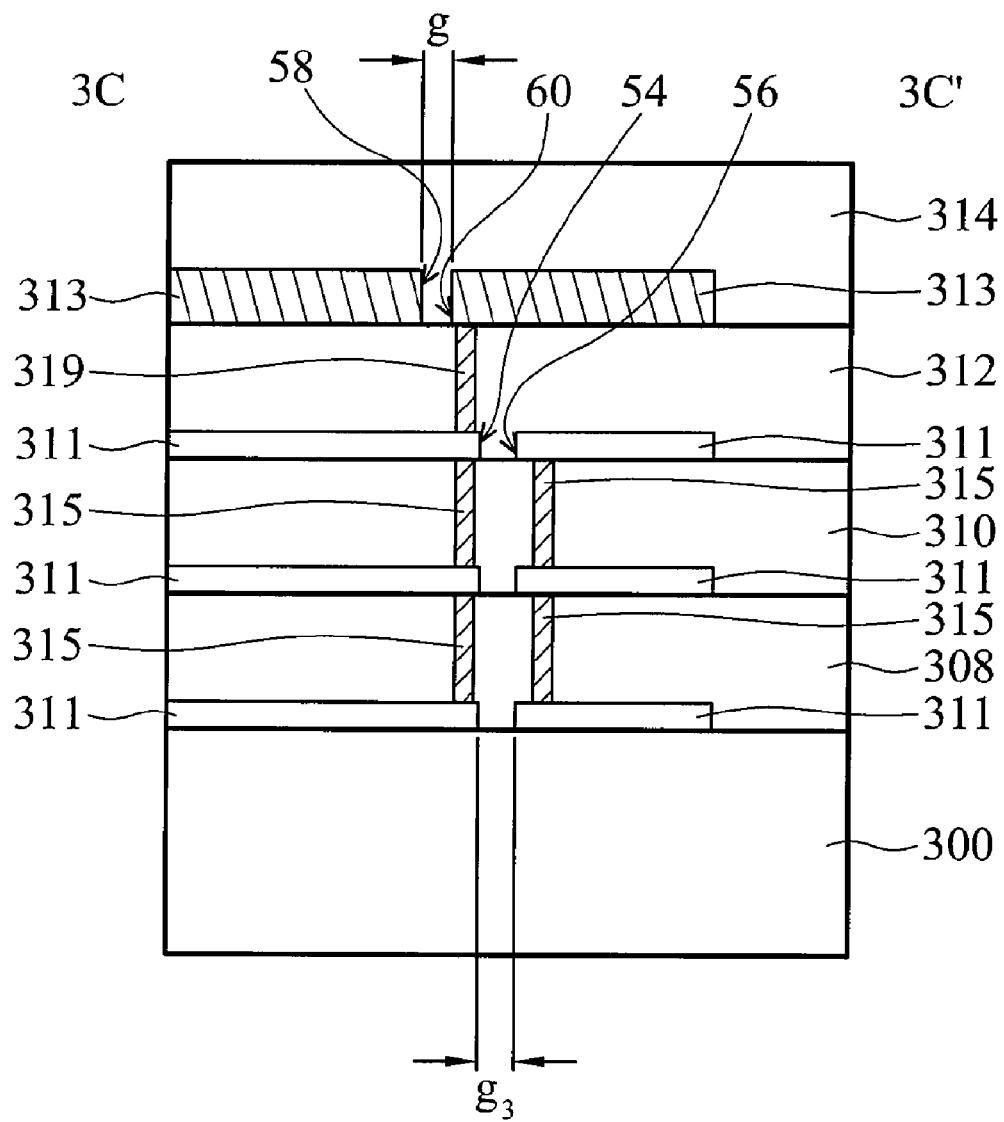
FIG. 3C is a cross-section along 3C-3C' line shown in FIG. 3A.

FIG. 3A is a plan view of an embodiment of a multilayer winding inductor. FIGS. 3B and 3C are cross-sections along 3B-3B' and 3C-3C' lines, respectively. The multilayer winding inductor comprises multi-level and single-level interconnect structures embedded in an insulating layer on a substrate 300. The substrate 300 may be a silicon substrate or other semiconductor substrate. The substrate may include various elements, such as transistors, resistors or other well known semiconductor elements. Moreover, the substrate 300 may also include other conductive layers (e.g. copper, aluminum or a combination thereof) embedded within the insulating layer. To simplify the diagram, only a flat substrate is depicted. Additionally, the insulating layer may include dielectric layers 308, 310, 312 and 314 successively disposed on the substrate 300, which may be the silicon oxide, silicon nitride or low k dielectric material.

The multi-level interconnect is embedded in the dielectric layers 308, 310 and 312, comprising a plurality of looped conductive traces 311 formed in the dielectric layers, respectively, and a plurality of conductive plugs 315. For example, the looped conductive traces 311 may be correspondingly disposed in the dielectric layers 308, 310 and 312. The looped conductive traces 311 overlap and are separated from each other. Moreover, as shown in FIG. 3C, each looped conductive trace 311 has a gap $g_3$ to define a first end 54 and a second end 56. In the other words, the first end 54 and the second end 56 of the looped conductive trace 311 are separated by the gap $g_3$. The looped conductive trace 311 may be circular, rectangular, hexagonal, octagonal or polygonal and the gaps $g_3$ of looped conductive traces 311 substantially aligned with each other. Here, only an exemplary octagonal looped conductive layer is depicted.

The conductive plugs 315 are disposed between the looped conductive traces 311 to serve as an electrical connection therebetween, in which at least two conductive plugs 315 are disposed between the neighboring looped conductive traces 311. Moreover, the upper conductive plugs 315 may be substantially aligned with the lower ones. In this embodiment, the looped conductive traces 311 and the conductive plugs 315 may be copper, aluminum or a combination thereof. More particularly, part of the conductive plugs 315 connect the first ends 54 of the conductive traces 311, and part of the conductive plugs 315 connect the second ends 56 of the conductive trace 311. Thus, one of the conductive traces 311 is coupled with other conductive traces 311 in parallel.

The single-level interconnect structure is embedded in the dielectric layer 314 and located over the multi-level interconnect structure. The single-level interconnect structure may include an uppermost looped conductive trace 313 and a conductive plug 319. The uppermost looped conductive trace 313 overlaps the looped conductive traces 311 and has a gap g to define a first end 58 and a second end 60. The uppermost looped conductive trace 313 and the looped conductive trace 311 have the same shape, such as octagonal. The gap g of the uppermost looped conductive trace 313 is not aligned with the gap $g_3$ of the looped conductive trace 311. The uppermost looped conductive trace 313 is thicker than the looped conductive trace 311. For example, the uppermost looped conductive trace 313 has a thickness of about 2 μm and the looped conductive layer 311 has a thickness of about 0.53 μm. However, the thickness of each conductive layer depends on the restriction of manufacturing process and designing rules in accordance with the restrictions.

The conductive plug 319 is disposed between the second end 60 of the uppermost looped conductive trace 313 and the first end 54 of the looped conductive trace 311 adjacent thereto, to serve as an electrical connection between the multi-level and single-level interconnect structures. For example, the conductive plug 319 may be disposed between the uppermost looped conductive trace 313 and the looped conductive trace 311 adjacent thereto and aligned with one of the underlying conductive plug 315, as shown in FIG. 3C. Thus, the uppermost looped conductive 313 and the looped conductive traces 311 are coupled in series to form the conductive path of the inductor. In this embodiment, the uppermost looped conductive trace 313 and the conductive plug 319 may be copper, aluminum or a combination thereof.

In this embodiment, the multi-level interconnect structure serves as a lower winding layer of the inductor and the single-level interconnect structure serves as an upper winding layer of the inductor. As shown in FIG. 3B, the external or internal circuits provide a current passing through the multi-level interconnect structure (i.e. lower conductive trace), the conductive plug 317, and the single-level interconnect structure and utilize the inductance induced by the inductor. The conductive plug 317 and the conductive trace 341 may also be copper, aluminum or a combination thereof. Additionally, note that the exemplary of the multi-level interconnect structure includes three-level looped conductive traces 311 embedded in the dielectric layers 308, 310 and 312, respectively. In some embodiments, however, the multi-level interconnect structure may include two-level or more than three-level looped conductive traces 311.

According to the inductor of the invention, since the lower conductive trace includes multi-level interconnect structure in which each conductive trace is connected in parallel, series resistance can be reduced to maintain the Q value of the inductor. Moreover, since the upper conductive trace of the inductor overlaps the lower conductive trace, the relative size is smaller compared to the conventional planar spiral inductor, such that integration and the device performance can be increased.

Figure 4A:
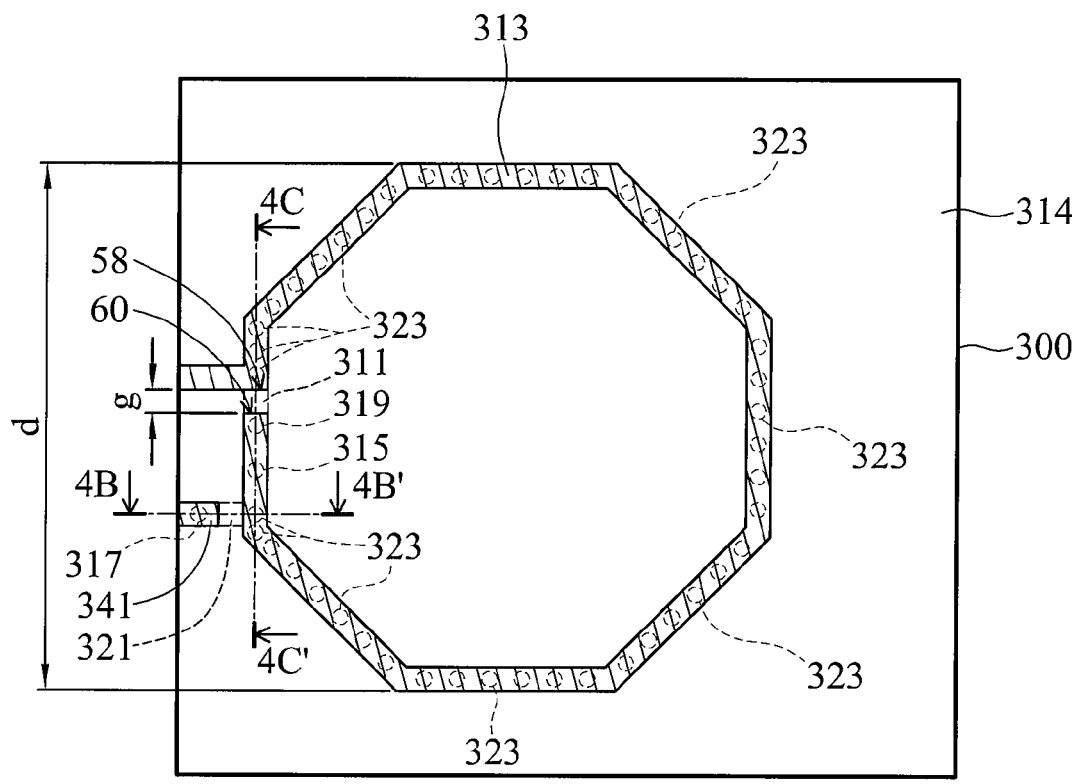
FIG. 4A is a plan view of another embodiment of a multilayer winding inductor.
Figure 4B:
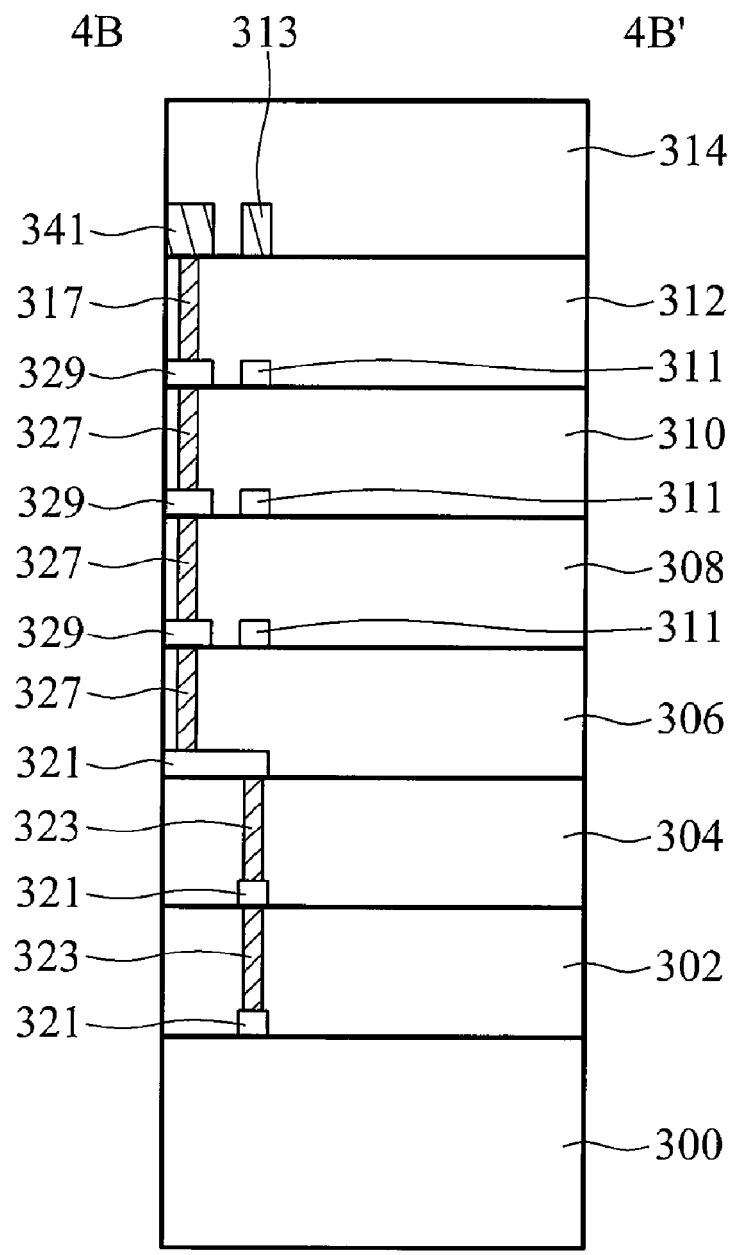
FIG. 4B is a cross-section along 4B-4B' line shown in FIG. 4A.
Figure 4C:
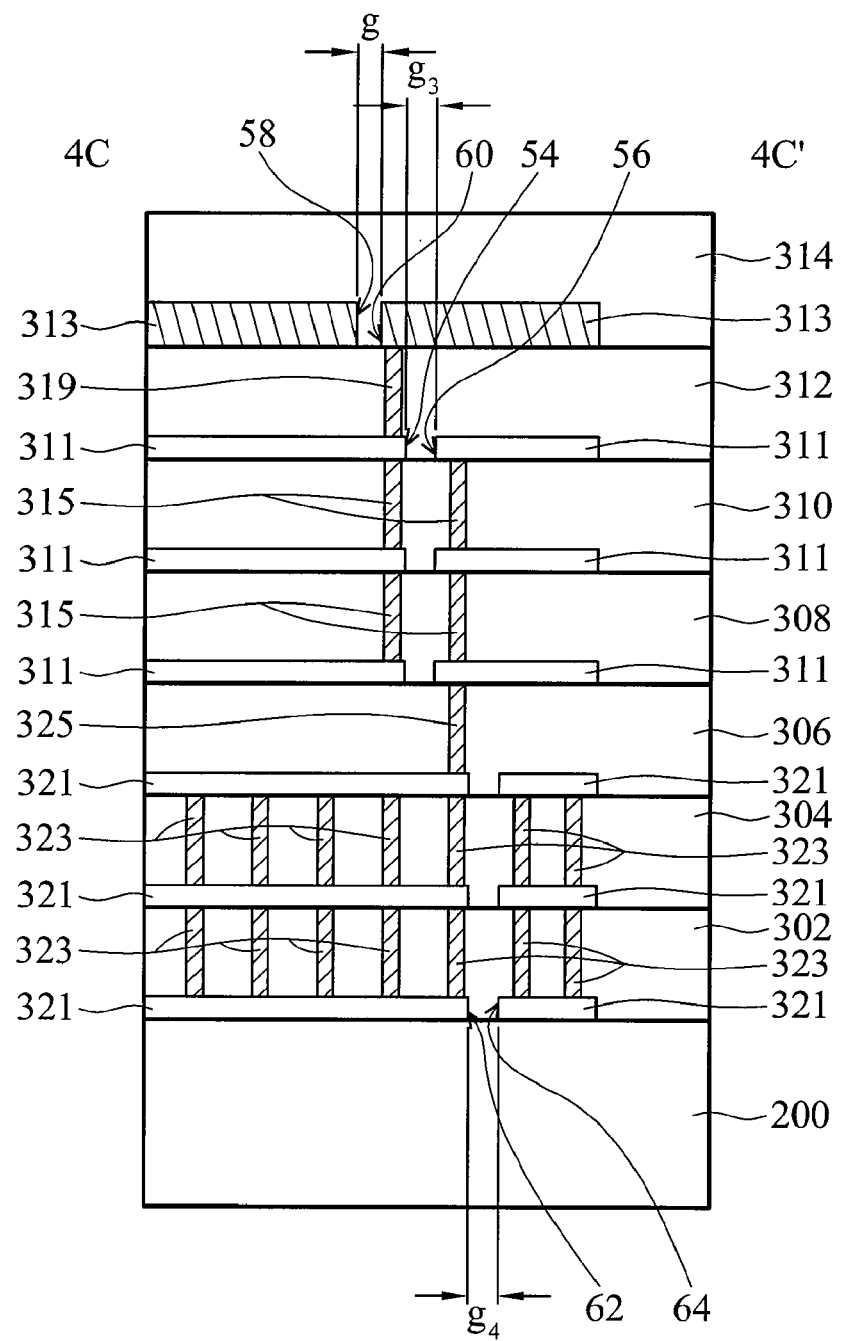
FIG. 4C is a cross-section along 4C-4C' line shown in FIG. 4A.

FIG. 4A is a plan view of an embodiment of a multilayer winding inductor. FIGS. 4B and 4C are cross-sections along 4B-4B' and 4C-4C' lines, respectively, in which the same reference numbers as FIGS. 3A to 3C are used, wherefrom like descriptions are omitted. The multilayer winding inductor includes two multi-level interconnect structures and a single-level interconnect structure embedded in an insulating layer on a substrate 300. In this embodiment, the insulating layer may be dielectric layers 302, 304, 306, 308, 310, 312 and 314 successively disposed on the substrate 300. Unlike the embodiment shown in FIGS. 3A to 3C, an additional multi-level interconnect structure is embedded in the dielectric layers 302, 304 and 306 and located under the multi-level interconnect structure formed by the looped conductive traces 311. The additional multi-level interconnect structure includes a plurality of looped conductive traces 321 and conductive plugs 323 and 325.

For example, the looped conductive layers 321 may be correspondingly disposed in the dielectric layers 302, 304 and 306. The looped conductive traces 321 overlap and are separated from each other. Moreover, as shown in FIG. 4C, the looped conductive trace 321 has a gap $g_4$ to define a first end 62 and a second end 64. The looped conductive trace 321 may have the same or different shape as the looped conductive traces 311. Moreover, the looped conductive trace 321 may have the same thickness as the looped conductive traces 311 and be thinner than the uppermost looped conductive trace 313. The gaps $g_4$ of the looped conductive traces 321 are substantially aligned with each other, but not with gaps g and $g_3$.

The conductive plugs 323 are disposed between the looped conductive traces 321 to serve as an electrical connection therebetween, in which at least two conductive plugs 323 are disposed between the neighboring looped conductive traces 321. For example, a plurality of conductive plugs 323 is disposed between the neighboring looped conductive traces 321, thereby reducing the resistance of the multi-level interconnect structure to further reduce the series resistance. Moreover, the upper conductive plugs 323 may be substantially aligned with the lower ones. The conductive plug 325 is disposed between the second end 56 of the looped conductive traces 311 and the first end 62 of the looped conductive layers 321 adjacent thereto, to serve as an electrical connection between the multi-level interconnect formed by the looped conductive traces 311 and the multi-level interconnect formed by the looped conductive traces 321. For example, the conductive plug 325 is disposed between the looped conductive traces 311 and the looped conductive traces 321 adjacent thereto, and aligned with one of the underlying conductive plugs 323, as shown in FIG. 4C. In this embodiment, the looped conductive traces 321 and the conductive plugs 323 may be copper, aluminum or a combination thereof.

In this embodiment, the multi-level interconnect structure formed by the looped conductive traces 321 serves as another lower conductive trace of the inductor. As shown in FIG. 4B, the external or internal circuits provide a current passing through the lower multi-level interconnect structure (i.e. lower conductive trace), the conductive plug 327, the upper multi-level interconnect structure (i.e. upper conductive trace), the conductive plug 317, and the single-level interconnect structure and utilize the inductance induced by the inductor. The conductive plug 327 and the conductive trace 329 may also be copper, aluminum or a combination thereof. Additionally, note that the exemplary multi-level interconnect structure includes three-level looped conductive traces 321 embedded in the dielectric layers 302, 304 and 306, respectively. In some embodiments, however, the multi-level interconnect structure may include two-level or more than three-level looped conductive traces 321.

According to the inductor of the invention, since the lower conductive trace includes multilayer winding structure in which each conductive trace is connected in parallel, the series resistance can be reduced to maintain the Q value of the inductor. Moreover, since the upper conductive trace of the inductor overlaps the lower conductive trace, the relative size is smaller compared to the conventional planar spiral inductor, such that integration and the device performance can be increased. Additionally, since the inductor includes two overlapping lower conductive traces, higher inductance can be obtained.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A multilayer winding inductor, comprising:
   an insulating layer disposed on a substrate;
   a first multi-level interconnect structure embedded in the insulating layer, comprising:
      a plurality of first looped conductive traces overlapping and separated from each other, each first looped conductive trace having a gap to define a first end and a second end separated therefrom by the gap; and
      a plurality of first conductive plugs disposed between the plurality of first looped conductive traces, electrically connecting the plurality of first looped conductive traces, wherein at least two first conductive plugs are disposed between the first ends of the neighboring first looped conductive traces and between the second ends of the neighboring first looped conductive traces, respectively; and
   a single-level interconnect structure disposed in the insulating layer and located over the first multi-level interconnect structure, comprising:
      an uppermost looped conductive trace having a gap to define a first end and a second end separated therefrom by the gap; and
      a second conductive plug disposed between the second end of the uppermost looped conductive trace and the first end of the first looped conductive trace adjacent thereto, to serve as an electrical connection between the first multi-level interconnect structure and the single-level interconnect structure.

2. The inductor as claimed in claim 1, further comprising:
   a second multi-level interconnect structure embedded in the insulating layer and located under the first multi-level interconnect structure, comprising:
   a plurality of second looped conductive traces overlapping and separated from each other, each second looped conductive trace having a gap to define first and second ends;
   a plurality of third conductive plugs disposed between the plurality of second looped conductive traces, electrically connecting the plurality of second looped conductive traces, wherein at least two third conductive plugs are disposed between the neighboring second looped conductive traces; and
   a fourth conductive plug disposed between the second end of the first looped conductive trace and the first end of the second looped conductive trace adjacent thereto, to serve as an electrical connection between the first and second multi-level interconnect structure.

3. The inductor as claimed in claim 1, wherein the uppermost looped conductive trace and the first looped conductive traces are the same shape.

4. The inductor as claimed in claim 3, wherein the uppermost looped conductive trace is circular, rectangular, hexagonal, octagonal or polygonal.

5. The inductor as claimed in claim 1, wherein the uppermost looped conductive trace is thicker than one of the first looped conductive trace.

6. The inductor as claimed in claim 1, wherein the gaps of the first looped conductive traces are substantially aligned with each other and not aligned with the gap of the uppermost looped conductive trace.

7. The inductor as claimed in claim 1, wherein an upper first conductive plug is substantially aligned with a lower first conductive plug.

8. The inductor as claimed in claim 1, wherein the first multi-level interconnect structure comprises copper, aluminum or a combination thereof.

9. The inductor as claimed in claim 1, wherein the single-level interconnect structure comprises copper, aluminum or a combination thereof.

10. The inductor as claimed in claim 1, wherein the insulating layer comprises a plurality of dielectric layers.

11. An inductor formed in a semiconductor chip, comprising:
    a substrate;
    a plurality of dielectric layer stacked upon the substrate;
    a plurality of first looped conductive traces formed in some of the dielectric layers respectively, and the first looped conductive traces coupled in parallel; and
    at least a second looped conductive trace formed in some of the dielectric layer, wherein the second looped conductive trace is overlapped with the first looped conductive traces and coupled to the first looped conductive traces in series to form a conductive path of the inductor.

12. The inductor formed in a semiconductor chip as claimed in claim 11, wherein the first looped conductive trace is circular, rectangular, hexagonal, octagonal or polygonal.

13. The inductor formed in a semiconductor chip as claimed in claim 11, wherein the second looped conductive trace has a thickness thicker than a thickness of one of the first looped conductive traces.

14. The inductor formed in a semiconductor chip as claimed in claim 11, wherein the second looped conductive trace is circular, rectangular, hexagonal, octagonal or polygonal.

15. The inductor formed in a semiconductor chip as claimed in claim 11, further comprising at least one pair of first conductive plugs connecting the first looped conductive traces in parallel.

16. The inductor formed in a semiconductor chip as claimed in claim 15, wherein each first looped conductive traces has a first gap, and a first end of the first looped conductive trace and a second end of the first looped conductive trace are separated by the first gap.

17. The inductor formed in a semiconductor chip as claimed in claim 16, wherein the first end of the first looped conductive traces is connected through one of the pair of first conductive plugs and the second end of the first looped conductive traces is connected through the other of the pair of first conductive plugs.

18. The inductor formed in a semiconductor chip as claimed in claim 15 further comprising a second conductive plug connecting one of the first looped conductive traces and the second looped conductive trace in series.

19. The inductor formed in a semiconductor chip as claimed in claim 18, wherein the second looped conductive trace has a second gap and, one end of the second looped conductive trace adjacent to the second gap connects the second conductive plug.

20. The inductor formed in a semiconductor chip as claimed in claim 11 further comprising a plurality of third looped conductive traces formed in some of the dielectric layers respectively, wherein the third looped conductive traces are coupled in parallel, and the third looped conductive traces, the first looped conductive traces and the second conductive trace are connected in series.

* * * * *